United States Patent [19]
Hoffman et al.

[11] Patent Number: 6,113,722
[45] Date of Patent: *Sep. 5, 2000

[54] MICROSCOPIC TUBE DEVICES AND METHOD OF MANUFACTURE

[75] Inventors: Wesley P. Hoffman; Phillip G. Wapner, both of Palmdale, Calif.

[73] Assignee: The United States of America as represented by the Secretary of Air Force, Washington, D.C.

[ * ] Notice: This patent is subject to a terminal disclaimer.

[21] Appl. No.: 08/928,977

[22] Filed: Sep. 12, 1997

Related U.S. Application Data

[63] Continuation-in-part of application No. 08/229,962, Apr. 15, 1994, which is a continuation-in-part of application No. 07/980,317, Nov. 16, 1992, Pat. No. 5,352,512, which is a continuation-in-part of application No. 07/691,582, Apr. 24, 1991, abandoned.

[51] Int. Cl.$^7$ ............................... C03C 25/68; B32B 5/24
[52] U.S. Cl. .................... 156/155; 428/311.51; 428/334; 428/335; 428/336; 428/337; 428/338; 428/339; 428/398; 428/401; 428/408; 428/605; 428/613; 428/698; 428/903; 501/1; 501/81; 502/439; 502/527.16; 216/58; 264/81; 264/135; 264/137; 264/221; 264/257; 65/438; 65/439; 65/901
[58] Field of Search ............................... 428/311.51, 288, 428/334, 335, 336, 337, 338, 339, 398, 401, 408, 605, 613, 698, 903; 264/81, 135, 137, 221, 257; 501/1, 81, 95; 502/439, 527; 156/643; 216/58; 65/438, 439, 901

[56] References Cited

U.S. PATENT DOCUMENTS 5,011,566   4/1991   Hoffman .................................. 156/643

*Primary Examiner*—Terrel Morris
*Assistant Examiner*—John J. Guarriello
*Attorney, Agent, or Firm*—Stanton E. Collier

[57] ABSTRACT

The invention comprises devices composed of at least one microscopic hollow tube having a wall of single or multiple layers with a thickness of at least one nanometer and a diameter of at least 5 nanometers. The walls of the tubes can be formed from a wide variety of materials, some of the preferred materials include metals, polymers, carbon, ceramics, glasses. If the space between the tubes is filled, the tubes become channels in a monolithic or composite body. The channels can have a random or ordered orientation. The interior of the tube walls can be coated with a desired material such as a catalyst and also may have depressions or elevations therein that were imparted to the fibers upon which the tubes are formed. The wall layers may be porous for the purpose of removing the fiber therethrough. Microtubes and microtube devices may be interfaced with the macroscopic world in a number of ways. Further the hollow tubes can be used to form rods or filaments in any desired configuration after the tube walls of a filled tube are removed.

25 Claims, 7 Drawing Sheets

17 Microns

9x3 Microns

56 Microns

59 Microns

Nickel / Silver

Silver / Sapphire

Taper

Linear Tube, Small end

Linear Tube, Large End

Linear Tube, Both end

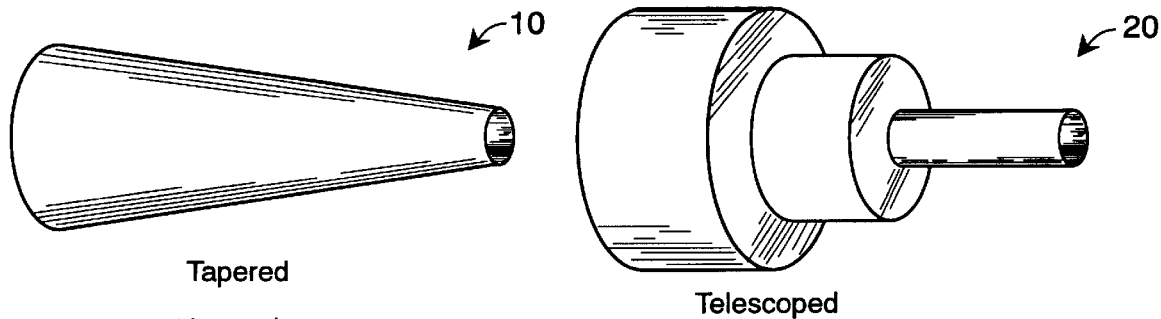
Tapered
*Fig. 7e*
Telescoped
*Fig. 7f*
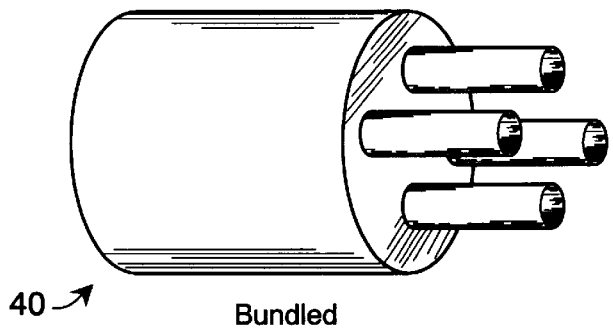
Bundled
*Fig. 7g*
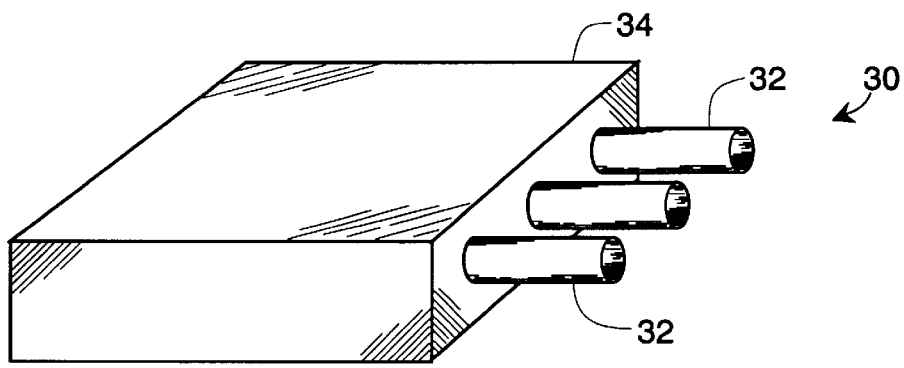
Manifolded
*Fig. 7h*

MICROSCOPIC TUBE DEVICES AND METHOD OF MANUFACTURE

This application is a continuation-in-part of application Ser. No. 08/229,962, filed Apr. 15, 1994, which is a continuation-in-part of application Ser. No. 07/980,317, now U.S. Pat. No. 5,352,512 filed Nov. 16, 1992, which is a continuation-in-part of Ser. No. 07/691,582, now abandoned filed Apr. 24, 1991.

STATEMENT OF GOVERNMENT INTEREST

The invention described herein may be manufactured and used by or for the Government for governmental purposes without the payment of any royalty thereon.

BACKGROUND OF THE INVENTION

This invention relates to the manufacture of devices using microscopic hollow tubes. These devices can have a myriad of applications that are as diverse as lightweight thermal-barrier material, heat exchangers and heat pipes for cooling electronic circuits, gas separation, encapsulation, sensors and detectors, optical wave guides, micro-electrical-mechanical devices injectors, dies, liquid-spill cleanup, and composite reinforcement to name a few applications. The shortcoming of current technology for fabricating microscopic tubes is that tubes can only be fabricated by drawing down a larger tube to microscopic dimensions. This, of course, limits the type of material from which tubes can be manufactured. A drawing process also does not allow accurate control over tube wall thickness, cross-sectional shape, or composition through the wall. A need therefore exists for a process in which microscopic tubes can be made from any type of material.

A need also exists for a manufacturing process that will be able to fabricate microscopic tubes with any cross-sectional shape and with accurately controlled walled thickness.

A need exists to be able to manufacture microscopic tubes with walls that have layers of different materials that are precisely controlled in thickness, composition and microstructure.

A need exists to be able to transition from a microscopic hollow tube to the macro-world.

A further need exists for producing devices having microscopic hollow tubes therein having walls with multiple layers, having coatings thereon, etc.

These and many other objects and advantages of the present invention will be readily apparent to one skilled in the pertinent art from the following detailed description of a preferred embodiment of the invention and the related drawings.

SUMMARY OF THE INVENTION

The invention comprises a device composed of at least one microscopic hollow tube having a wall of single or multiple layers with a thickness of at least one nanometer and a diameter of at least 5 nanometers. The tubes can be formed from any type of materials, some of the preferred materials include metals, polymers, carbon, ceramics, and glasses although any type of alloy, compound, composite, foam, or aggregate of particulates could also be used.

The invention also comprises a method for forming the microscopic tubes and microscopic tube devices. The method begins with the selection of fibers having a predetermined rate of reaction or solvation at specific temperatures. The fibers are then kept separated from one another either individually or positioned in a preform corresponding to a desired final tube configuration. The fibers are then cleaned or pre-treated, if necessary, and the temperature of the fibers adjusted to a preferred deposition temperature. A tube material is then deposited on the fibers to coat them. Any of these steps can be performed in vacuum, an inert atmosphere, or a controlled atmosphere if necessary. Additional layers of the same or different materials may be deposited. The tube material has a significantly lower rate of reaction or solvation at specific temperatures than the fibers. The coated fibers may then be placed in a solvent or reactive environment and heated if necessary to a temperature at which the fiber is removed at a rate significantly greater (at least an order of magnitude) than which the fiber coating is removed. During this reaction or solvation, there is no ignition of the fiber material or build up of gas pressure that would damage the tubes which remain after the fiber is removed. Alternatively, it is possible to remove the fiber through a phase change (i.e. to a liquid or a gas) under conditions in which the tube material remains unaffected.

In a preferred embodiment of the invention, the tube material is deposited on the fibers by magnetron sputtering after the fibers have been cleaned in a high vacuum environment. In one preferred embodiment of the invention the initial fibers comprise carbon fibers, however, any other microscopic fibers may be used. Silica and other high temperature materials are preferred coating materials for the fibers in the preferred embodiment of the invention which utilizes carbon fibers.

In another preferred embodiment of the method of this invention, the metal or polymer fibers used for forming microscopic tubes are removed from the deposited tube material by means of a solvent or a dissolving acid. The solvent or dissolving acid dissolves the coated fiber but is incapable of dissolving the tube material under the conditions used to remove the fiber.

BRIEF DESCRIPTION OF THE DRAWINGS

The drawings are not intended to limit the invention in size or shape but rather to illustrate a typical product produced according to the principles of this invention. Some of the drawings have been made from scanning electron microscope photographs showing the ends of some representative microscopic hollow tubes produced accordingly to the principles of this invention.

FIGS. 7A to 7H illustrate different ways to interface microscopic tubes with the macro-world.

DETAILED DESCRIPTION OF THE PREFERRED EMBODIMENT

Figure 1A:
FIGS. 1A, 1B, 2 and 3 illustrate some of the various hollow tube shapes available by use of the present invention.
Figure 1B:
Figure 2:
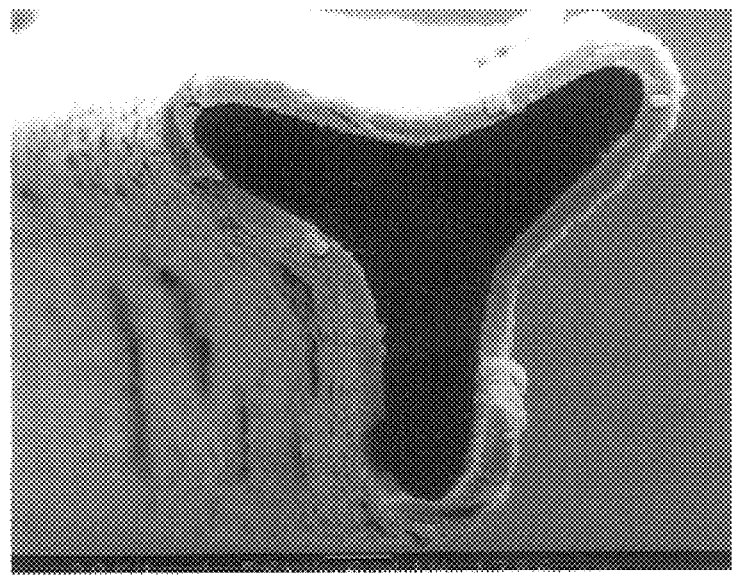
Figure 3:
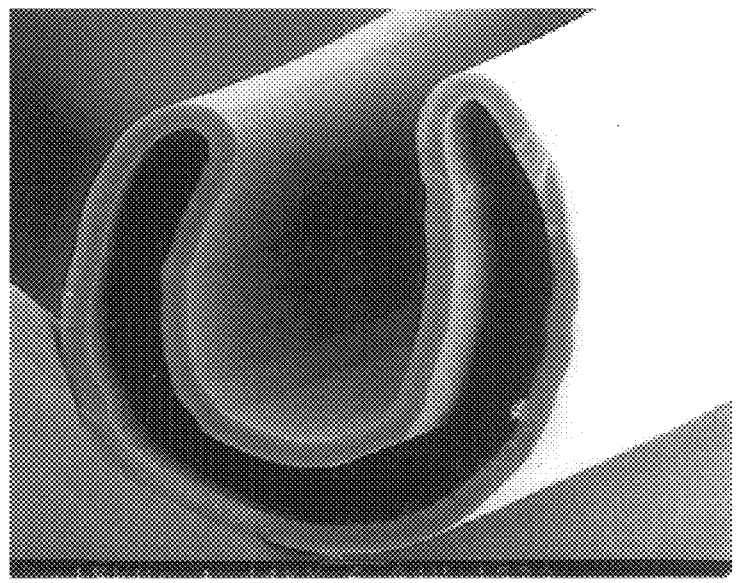

This invention offers a unique method to fabricate straight, curved, or coiled hollow tubes and tube devices with tubes as small as 5 nanometers in diameter with wall thickness starting at about one (1) nanometer.

These devices can be made from any material that can be applied to a surface of carbon, graphite, polymer, metal, glass, ceramic, or other tube forming fibers and then made to withstand the environment used to remove the fiber. The microscopic tubes are manufactured by applying at least one surface coating of material such as polymers, carbon, metals, ceramics, semiconductor, glasses, carbon, diamond, alloys, compounds, composite materials, foams, or aggregates of particulates to a microscopic fiber which is then removed. The surface coating is not materials limited because there are so many different processes to apply the coating, which include but are not limited to chemical vapor deposition, sputtering, electrophoresis, plasma-enhanced deposition, electroplating, electroless deposition, spraying, dipping and coacervation.

For most applications, prior to the coating process the fibers are separated. They are kept separate and discrete from one another during the coating process. This can be achieved in numerous ways which include both those used for batch processing as well as those that involve continuous processing. In batch processing the fibers can be held, for example, in a fiber coating holder or processed individually in a stirred solution or fluidized bed. Alternatively, they can be placed and held in a preform with the location, orientation, and configuration desired for the tubes in the final product. For continuous processing, the fibers could be separated and placed, for example, in groves on rollers or held in guides so that they remain distinct and separated as they travel from one roller to another. After the fibers are separated, they are then cleaned or pre-treated, if necessary, to facilitate uniform deposition of a coating material. The fibers are then coated with a desired material that will form the tubes when the fibers are removed. For example, carbon or graphite fibers can be removed from a silica coating by reaction with a gas phase species such as air, oxygen or hydrogen. A glass or quartz fiber, for example, can be easily removed with hydrofluoric acid, while a polymer fiber can be removed with an appropriate solvent.

In order to enhance the rate of fiber removal, a hollow fiber can be used as a substrate. Of course, before hollow fibers are coated with tube wall material, there must be a means to prevent entrance of the coating material into the interior of the fiber. This can be accomplished by several techniques. It is possible, for example, to physically prevent entrance of the tube wall material, such as with a plug or end cap. This barrier material can be made from a sacrificial material or a material that will be removed for example by cutting or machining before the fiber is removed. Alternatively, one could use a technique for depositing wall material that coats the exterior but not the interior of the hollow fiber. These techniques would fall under the category of line-of-sight, such as spraying or electrodeposition, or under the category of surface treatment methods. In the latter, the interior of the hollow fiber would be coated so that interior wetting does not occur and therefore deposition on the interior would be prevented. Regardless of whether the fiber substrates are hollow or solid, in order to enhance the rate of removal of the fiber, the continuous coated fibers are cut to length and the ends of the individual coated fibers are exposed prior to removing the fiber. The preferred method of removing other fiber materials depends on their chemical and physical structure. Some fibers can be removed by decomposition such as with the use of heat (pyrolysis) or with energetic beams or radiation while some polymer fibers can undergo quantitative depolymerization to the monomer. In addition, it is possible to remove other fibers using a phase change such as melting. Finally, it is possible to physically pull-out a fiber from the formed tube material if the surface of the fiber has been partially removed by solvation or reaction for example.

Once the fiber is removed, the microscopic tube of coating material or materials remains. These tube walls may have been physically or chemically altered or changed during the fiber removal process. If this change is not intentional, this tube can then undergo post-fabrication treatment such as sintering or annealing to improve its properties. Alternatively, this treatment or another treatment can occur either before or while the fiber is being removed. An example of concurrent fiber removal and tube treatment is the formation of a ceramic oxide tube on a carbon fiber. In this case, the carbon fiber is removed and the ceramic is simultaneously sintered by heating the coated fiber in an oxidizing environment. Of course, the coating could first be sintered in an inert atmosphere and then the fiber removed in an oxidizing atmosphere if that were needed. After proper treatment, these tubes have been found to be quite sound structurally. Even microscopic tubes made of quartz have been found to be very strong mechanically. Specifically, quartz tubes with wall thickness of less than 0.01 microns have been found to be surprisingly tough and to maintain their integrity under harsh agitation.

Tubes formed in this way may be fabricated to stand alone in practically any shape imaginable, or the spaces between the coated fibers can be filled in with the tube material or any other material. The fibers are then removed to produce a strong lightweight monolithic or composite structure with the tubes now being channels therein. These tubes can be positioned in a specific orientation or they can be randomly positioned depending on the application. If the matrix material between the coated fibers and ultimately between the tubes after fiber removal is the same as the material of the tube wall, the process of tube forming and matrix filling can be a single step. However, processes for rapid filling of the space between the tubes, such as, electrolysis or infusion of ceramic slurries do not always produce tube walls with properties as good as other processes, such as CVD or sputtering. Thus, a two step process is frequently used to rapidly and inexpensively produce a monolithic or composite structure with channel walls of high quality. Alternatively, the fiber can be removed prior to filling in the space between the tubes if the ends of the tubes are sealed to prevent entrance of the "matrix" material. This sealing material, of course, must be removed prior to using the device. The resulting channels can transport gas or liquid, serve as an electromagnetic wave-guide, or serve to lower structural weight through a reduction of bulk density. Such structures utilize the innate high structural strength of hollow tubes to form strong structural components. Further, the hollow tubes form thermal barriers that reduce the passage of heat.

In addition, this technology can be used to replace other processes such as drilling. That is, with this technology, to make a hole or numerous holes in a material, it is simply necessary to place fibers in the desired configuration and fill up the space around these fibers to the desired volume. When the fiber or fibers are removed, holes of microscopic dimensions result. An injector or a die, for example, can be made in this manner. This technique allows microscopic holes to be made in brittle and very hard materials which are difficult or impossible to make with other techniques. For example, a microscopic hole in a brittle ceramic can be made inexpensively to very precise submicron dimensions by holding a carbon fiber in a desired configuration in a mold. A ceramic powder or slurry, for example, can then be used to fill the mold and surround the fiber. After sintering the ceramic in an inert environment the fiber is removed producing a microscopic hole.

The basis for this invention is the production of tubes of coating material that are not destroyed by the conditions used to remove the fibers. However, it is possible that for some special applications the wall material will be chemically or physically changed during the removal process. Two specific fabrication techniques for microscopic tube formation which utilize two different fiber substrates are presented below.

EXAMPLE 1

This example discloses the fabrication of metal tubes and begins with a polymer fiber that will easily depolymerize. To form metal tubes it is preferred to use a polymer fiber such as Poly (alpha-methlystyrene) or Poly (methylmethacrylate) that will depolymerize 100% and thus vaporize at relatively low temperatures leaving no residue. Prior to the coating process the fibers are separated. They are kept separate and discrete from one another during the coating process. This can be achieved, for example, by placing the discrete fibers in a fiber coating holder or by keeping them separate as they move from one fiber roller to another in a continuous coating process. After being separated, they are cleaned in high vacuum before being coated in a magnetron sputtering system to metallize the surface. The cleaning and deposition can be performed at elevated temperatures to get better adherence between the coating and the fiber surface as well as to obtain better microstructural properties in the coating. Coating is continued until the desired wall thickness is obtained. For thin walls (<5 microns) or for free-standing tubes, deposition is usually continued uninterrupted to completion in the magnetron. If thick tube walls are required it is usually preferable to remove the coated fiber from the magnetron. The process of coating can then continue using another techniques such as electrodeposition which is a much faster and less expensive deposition technique.

Once the desired coating thickness is achieved, the coated fiber can be removed from the coating holder or cut from the continuous coated fiber to produce individual discrete coated fibers. Alternatively, the coated fibers can be placed in a preform and the space between the coated fibers then filled with the same material as the fiber coating, or with a different material to produce a device with desired density containing oriented microchannels.

To remove the fibers, the coating on the end of the fibers is first removed. The device or coated fibers are then heated in vacuum or an inert environment to a temperature at which the polymer begins to undergo depolymerization. For Poly (alpha-methyl styrene), this temperature depends somewhat on the average molecular weight and is about 150° C. For Poly (methyl-methracrylate) the temperature is about 300° C. and again depends to some degree on the average molecular weight. The temperature for depolymerization is kept as low as possible so that as the polymer vaporizes, there is not excessive pressure buildup in the tube that can damage the tube wall. To further prevent buildup in the tube due to fiber vaporization, the coated fiber can be slowly passed through a temperature gradient so that the melting and/or vaporization of the fiber moves progressively down the tube from one end. This prevents pressure buildup by allowing the gas to escape through the open end of the tube. This process of gas removal can be enhanced by pumping on the open end of the tube. Alternatively or in addition, gas removal can be enhanced by using a hollow polymer fiber as a tube-forming substrate. Regardless of the type of polymer fiber substrate, once the polymer fiber has completely vaporized, a hollow tube of desired wall material is formed. After discrete hollow tubes have been formed, they can be used as discrete individual tubes or they can be mixed or coated with a matrix material that does not fill the tube to produce a material reinforced with random hollow tubes.

EXAMPLE 2

Figure 4A:
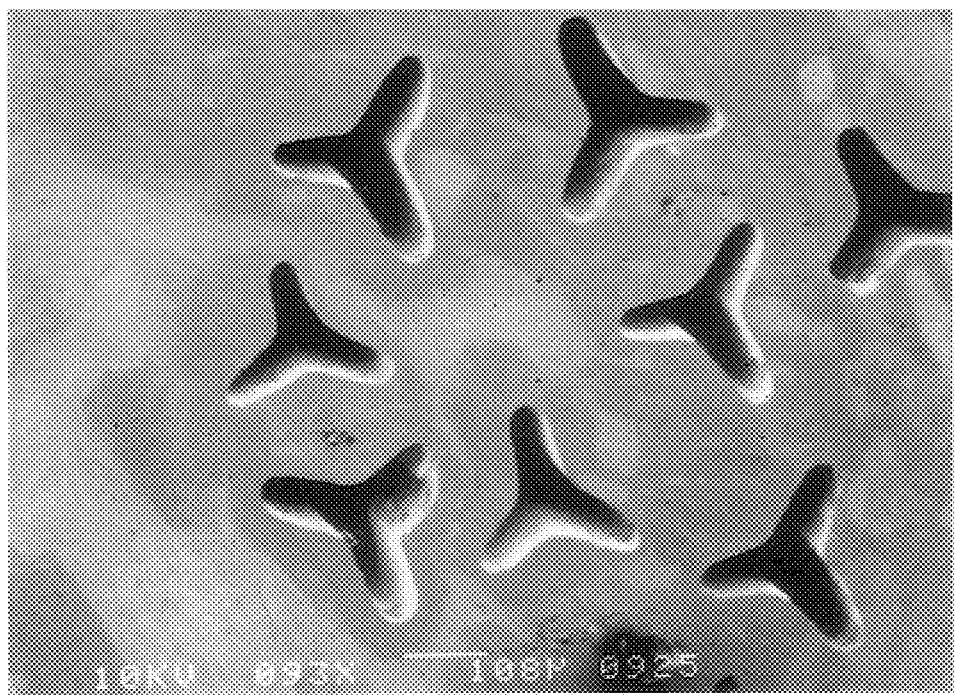
FIGS. 4A and 4B illustrate microtube composites.
Figure 4B:
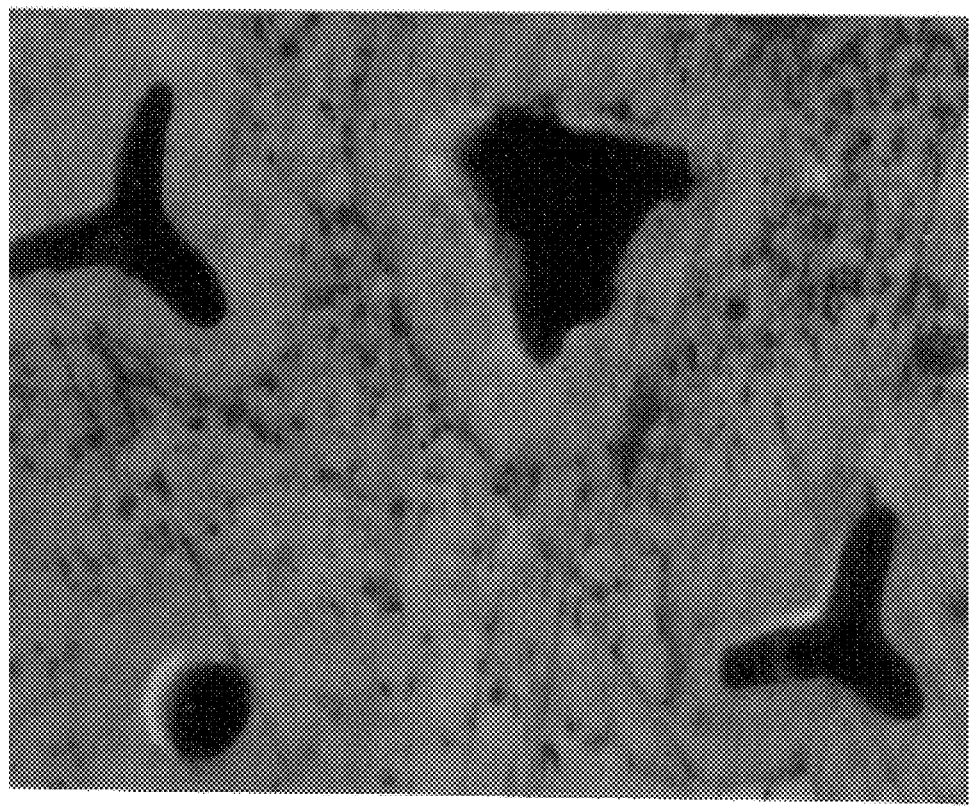

To form carbon or graphite tubes from quartz fibers the process is very similar to that just described. However, in this example, the fibers are placed and held in a preform with the location, orientation, and configuration desired for the tubes in the final product. After the quartz fibers are positioned and mounted in the desired configuration, they are cleaned by heating in vacuum. The temperature is then adjusted for the appropriate deposition. The deposition temperature depends on the type of hydrocarbon used. In this example, propylene was used to deposit a carbon coating, this required a deposition temperature greater than 650° C. in order to get a useful deposition rate. If methane had been used to deposit carbon on the quartz fiber the required deposition temperature would have been in excess of 900° C. The coated fiber was removed from the deposition reactor after the desired thickness of carbon had been deposited upon the quartz tube in a non-oxidizing environment. However, the deposition can be continued until all the space between the coated fibers is filled as seen in FIG. 4. When the quartz fibers were removed with hydrofluoric acid, a monolithic carbon device with micro-channels was formed. The two examples described above demonstrate the manufacture of microscopic tubes (or passages in structures) orders of magnitude smaller than any previously known. The inner wall of these tubes can be very smooth if the fiber surface is also smooth. The tubes can be made free-standing or they can be made so that they have the location, orientation and configuration of the fibers according to the way they were positioned prior to deposition or of the coated fibers according to the way they were positioned after deposition. Free-standing microtubes with a diameter in the range of 50 nanometers–1000 microns can hereby be fabricated. It should be noted, however, that in sizes below 3.0 microns the fibers and tubes can become a health hazard similar to asbestos fibers. Thus, care is needed in handling these fibers and tubes. When a monolithic device is formed by filling in the space between the coated fibers a multitude of microchannels are formed when the fibers are removed. Fabrication of materials having a multitude of microchannels will greatly reduce component weight without greatly affecting structural strength. In some instances proper tube orientation will actually give a micro-channel lightweight material greater strength and less weight than amorphous structures.

Figure 5:
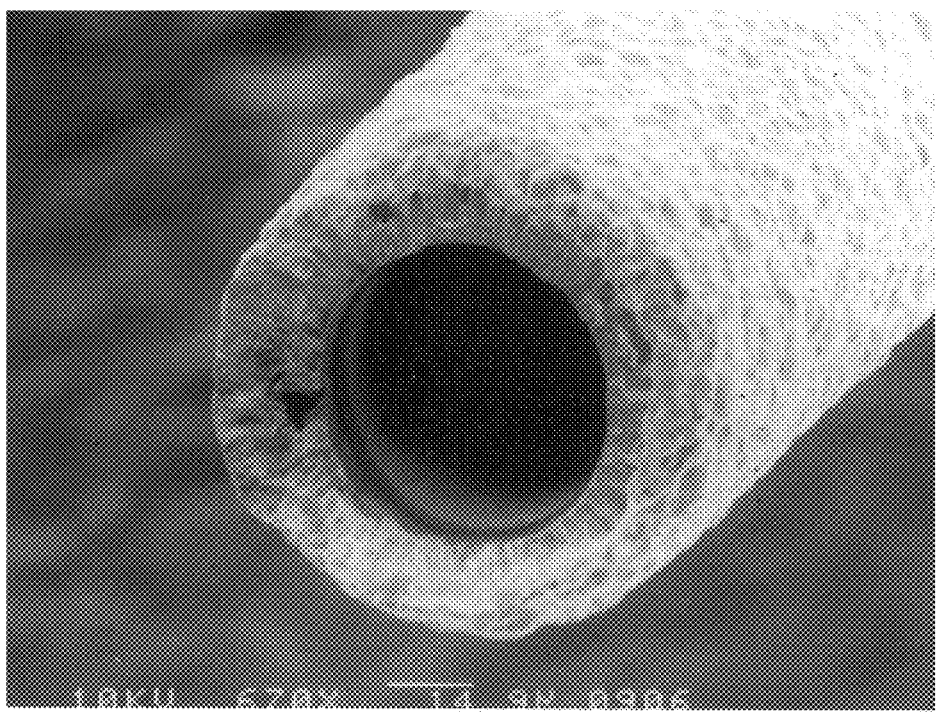
FIGS. 5 and 6 illustrate a hollow tube of sapphire with a silver lining.
Figure 6:
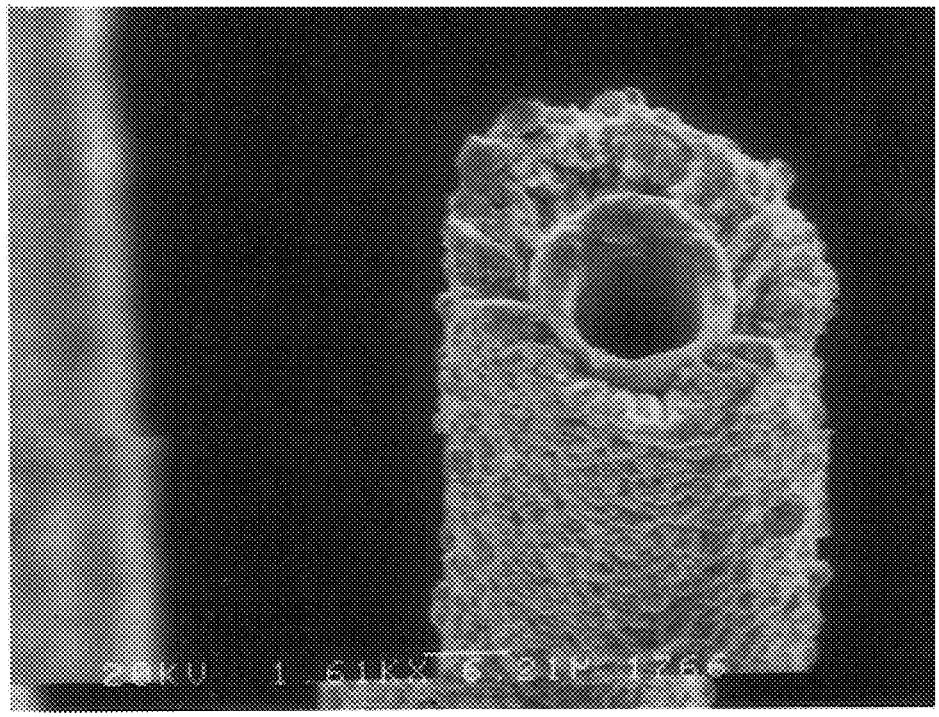

Microtubes used in these devices can be made with numerous layers in the wall if the fiber is coated with layers of material before the fiber is removed, but removing the fiber before the layers are all completed is clearly possible. FIGS. 5 and 6 illustrate sapphire tubes with a silver lining being of the order of 5 to 10 microns. A thin layer of silver was deposited on a fiber and then aluminum was deposited on the silver and then oxidized to form sapphire. After this the fiber was removed leaving the silver and sapphire layered tube wall. This layering process would have many different applications. These multiple layers would be useful as part of a device such as a multiple electrical conductor or capacitor in which there are alternate layers of conducting and insulating materials. The tube interior could be used for containing a cooling medium. An example of this would be to flow a cryogenic liquid down the center of a tube made of a superconducting material. In addition, it is sometimes useful to apply an easily removable sacrificial layer to the fiber so that the deposition of the actual tube material can be enhanced. For instance, to make a diamond tube it would be advantageous to apply a molybdenum, silicon, or nickel coating to a fiber surface to enhance the formation of a diamond coating. Both the fiber and the inner layer would then be removed leaving a diamond tube. Another example would be the application of an electrically conductive layer on an electrically insulative fiber so that the fiber could be used as a tube forming substrate in processes that need electrically conductive substrates such as electro-deposition or electrophoresis. Another use for the sacrificial layer on the fiber surface is for removal of the fiber itself after the coating process is completed. That is, for example, an easily removable catalyst can be placed on the fiber surface to facilitate fiber removal. Alternatively, an easily removable sacrificial layer can be placed on the fiber surface so that the fiber substrate can be pulled-out intact after the sacrificial layer is removed.

Another purpose for layers in the tube wall is to form a protective coating for the tube material itself. Thus, if the tube wall needed for the particular application was susceptible to oxidation or corrosion, it could be coated on the inside and outside with a layer of a material that does not oxidize or corrode under the conditions of the particular application.

Multiple tube wall layers can also be useful to extend the maximum length of the microtubes. That is, if the fiber coating is impervious, the rate of removal of the fiber will be limited by the rate of diffusion of the solvated fiber or fiber gaseous products down the interior of the fiber to the open end. This in turn for certain processes will be related to the rate of diffusion of the solvent or reactive medium down the interior of the tube to the fiber from the ends. Thus, the longer the tube, the longer it will take to remove the fiber. Under these conditions, there will be a maximum tube length that will be dictated by the economics of the fiber removal process. This diffusional length limitation can be avoided by applying a porous layer to the fiber which is substantially longer than its diameter and then removing the fiber by allowing the solvated fiber or gaseous fiber products to go through the porous tube wall. As an alternative to depositing a porous wall, a non-porous wall could be made porous by treatment, such as using radiation, or the porosity could be generated during the fiber removal process. The actual impervious tube wall could then be applied to the exterior of the porous tube wall and under certain conditions even into the porosity after the fiber had been completely removed. An additional method to extend the maximum length of microtubes is to use hollow fibers. With these substrates it is possible, for example, to pump reactant or solvent through their interior so that the fiber removal rate is dramatically increased. Thus, a much longer fiber can economically be removed. Since the removal of the fiber in these processes is no longer limited by diffusion of the solvated or gasified fiber down the tube to the ends, there would no longer be a limitation in microtube length.

Besides coating the outside of the tube it is also sometimes advantageous to coat the inside of microtubes for applications such as those that involve catalysis or wettability. This can be done in several ways. One can start with impurities in the fiber itself. After the fiber is coated with the tube material, it can be solvated, vaporized, or reacted away, for example. Some of the impurities in the fiber will then be deposited on the inside of the tube wall. Alternatively, the fiber can be coated with a partial monolayer of material and then subsequently coated with the tube material. When the fiber is removed, a dispersed coating of, for example, a catalyst will be left on the inside of the tube. A third option is to completely coat the fiber with a catalyst, for example, prior to the application of the actual structural tube material. When the fiber is removed, a tube coated on the interior will result. This complete interior coating would also be useful, for example, in making the interior of the structural tube wettable by a material that could then be sucked into the tube. Uses for this technology are as divers as micro-rod manufacture, microtube sensors and detectors, spill cleanup, and time-release devices.

In addition to coatings, the inner microtube surface can be textured or shaped to give any desired surface design or roughness. In order to roughen, texture, or shape the interior surface of the tube, the exterior surface of the fiber substrate must be modified. This can be accomplished by any technique that adds material, removes material, or rearranges material on the fiber surface before the tube material is applied. Examples of techniques for surface modification include: preferential etching of the fiber surface, selective local deposition of sacrificial or non-sacrificial materials on the fiber surface; and embossing of and/or flocking on the fiber. Both the fiber and any sacrificial material would then be removed. Some of these surface modification techniques are also useful for slightly roughening or chemically activating the fiber surface for enhanced deposition of the tube wall material or for changing the surface of the fiber in regard to its wettability or some other property.

This modification of the fiber surface prior to coating with the tube material can be a random process, such as for roughening the surface, or it can be a precise process to form ordered features on the surface. The simplest ordered features are a series of discrete island-type structures on the surface. These can consist of a series of discrete dots, cubes, or other geometric structures that can be deposited by a large variety of techniques, such as, photolithography or laser deposition. Because a large variety of techniques can be used, many different materials can be deposited individually or in combination with other materials to produce these features on the fiber surface. In addition to being discrete, these island-type structures can be interconnected, for example, by thin wire-like films or grids which can form either a single continuous path between all or only selected island-type structures. There may be more than one grid structure on each fiber surface. Depending upon the type of deposition technique, the structures on the surface can be randomly distributed or can be ordered, such as, in arrays.

In addition, it is possible to place layers of these features on the surface in a series of deposition processes that parallel the layering of the tube wall previously mentioned. Except, in this case, each layer would not be continuous but rather would have a precise structure and pattern formed, for example by masking, during the deposition process. The composition of these layers can vary from layer to layer and in some cases the material will be sacrificial while in other cases it will not. An application of this technology is the formation of micro-circuits or devices on the inside of tube walls after the tube wall material is deposited and the fiber, and in some cases, a portion of the precisely deposited structures are removed. Thus, with this technology it is possible to form integrated circuits and micro-devices on a circular non-planar surface. The advantage to this type of technology is that the circuit or device can be cooled by coolant that is confined to flow around the outside wall or through the tubes. This solves the major problem of component cooling that is facing the micro-circuit and micro-device manufacturers today as dimensions continue to shrink. Another advantage of this process is that it can easily be made to be continuous as fibers can be continuously rotated and translated behind a mask.

For any microtube, after the fiber is removed and the tube is formed, the tube can be filled with another material to make a microsensor or a detector far smaller than is now available.

The preferred fiber substrates for many tubes are carbon and graphite. Among their advantages, carbon and graphite are relatively chemically inert, except for oxidation, at temperatures below 2000° C. and do not react with most materials. In this case graphite does not outgas appreciably below 1500° C., so bubbles are not introduced into the tube structure during deposition. Furthermore, graphite is a high temperature material that can be used to form tubes at higher temperatures than other fibers can survive. In addition, it is electrically conductive which makes it a suitable substrate for electro-deposition and electrophoresis. Carbon fibers can be removed at a significant rate by exposure to oxygen or air at temperatures above 450° C. For forming tubes, the lower the carbon removal temperature the better. This is to minimize the rate of gasification so that gas pressure will not build up inside the tubes and fracture the thin tube walls.

As stated previously, impurities in or on the fiber at the time of coating are useful for depositing the impurity onto the inside tube wall when the fiber is removed. In addition, The impurities in or on the fugitive fiber can also be advantageous for fiber removal. Thus, for example, impurities in or on carbon fibers can enhance the oxidation of carbon fibers especially at low temperature. This phenomena can be used to decrease the time or the maximum temperature needed to completely remove the carbon fiber. Alternatively, if a hollow fiber is used, removal is also enhanced because the reactant can now flow down the interior of the fiber instead of just reacting or solvating at the end.

In addition, catalysts in the fiber or on the fiber substrate can be used to make certain devices. For example, in certain applications it is desirable to have reinforcing fibers in the device along with the tubes. This can obviously be done by using different fibers that after coating are removed by different means. Alternatively, if the device must be formed at elevated temperature and operate at very high temperature with high stiffness and strength, then only carbon fibers can be used. In this case the tube forming fibers would contain catalyst and the reinforcing fibers would not. After coating, the catalyzed fibers could be removed at very low temperatures whereas the uncatalyzed fibers would be unaffected. The result would be a microtube device with fibrous reinforcement.

Other fibers or filaments, however, may be best for specific purposes. For example, quartz or metal fibers are probably the best for fabricating carbon, diamond and diamond-like tubes while polymer fibers are best for making polymer tubes of different composition as well as numerous other types of tubes that are adversely affected by heat and acids, or are easily oxidized.

If a high temperature tube material is changed or damaged in an oxidizing environment, a reducing environment can be used to remove the carbon fiber. Carbon can be removed at a significant rate in hydrogen by forming methane at 1000° C. However, if the carbon fiber has a thin layer of nickel on its surface, underneath the coating for the tube wall, the carbon fiber can be removed by catalytic hydrogenation at temperatures as low as 600° C. if the nickel layer remains in contact with the carbon surface. The nickel layer can easily be removed with acid after the carbon fiber has disappeared.

Additional features of the present invention involve the fiber element. For example, discrete catalytic carbon fibers having a diameter of from 5 to thousands of nanometers can be used as sacrificial tube formers. They can be grown in linear form or can be grown in the shape of a miniature coil. Further, the fibers may be made of glass, ceramic, metal or they may be made of polymers so that the fiber removal can occur at very low temperatures without using acid to prevent damage to the tube wall. Polymer fibers may be removed by using solvents, by chemical reaction or by using heat to melt, pyrolyze, or depolymerize them. Glass and metal may be removed by, for example, acids. Further, these fibers (excluding catalytic carbon fibers) may have any cross-sectional shape such as a "C", an "X", a "Y", a star, a square, an oval, etc.

These fibers can also be hollow and are useful for the manufacture of microtubes and microtube devices for the same reasons stated previously for hollow circular fibers. Moreover, the fibers, whether circular or non-circular in cross-section, can have additional objects or materials implanted or imbedded in them, either in the fiber itself or in any hollow or void spaces, or in both. These objects can be continuous, such as microscopic metallic wire(s), or noncontinuous, such as particulates. The presence of these objects can be beneficial for a variety of reasons. These include but are not limited to the following:

(1) Provide additional support during microtube and microtube device manufacture.

(2) Provide electrical pathways either during processing of microtube or microtube device, or during subsequent microtube or microtube device application after fiber removal.

(3) Serve as an electrical heating element for use either during microtube or microtube device processing or in subsequent application of the microtube or microtube device after fiber removal.

(4) Serve as a feedstock of material for use either during microtube or microtube device manufacture or in subsequent application of the microtube or microtube device after fiber removal.

(5) Serve as a catalyst either during microtube or microtube device processing or in subsequent application of the microtube or microtube device after fiber removal.

These implanted or imbedded objects or materials either would remain in the final microtube or microtube device or could be removed after serving their purpose.

Polymer fibers of the desired diameter as small as 0.1 microns and of the appropriate cross-sectional shape are coated with metal, ceramic, glass, a different type of polymer, etc. The coating can be deposited by techniques such as magnetron sputtering, dipping, plasma spray, coacervation, polymeric polymerization, PVD, sol gel, plasma assisted PVD, etc. This coating process is performed at temperatures where both the fiber and the coating are stable and is preferably performed on a clean fiber surface. The temperature is usually below 300 degrees centigrade and can be performed with most coatings as low as room temperature if it is applied, for example, by magnetron sputtering.

After the coating has been deposited to the desired thickness (this can even fill in the volume between the fibers), the deposition process is terminated and the fiber is removed from the coating. For low temperature polymeric coatings, the fiber can be removed by an appropriate solvent that will not attack the coating. For example, polyacronitrile (PAN) fibers are soluble in tetramethylene sulfone; acrylic fibers are soluble in dilute bases; acetate fibers are soluble in methylene chloride, and nylon fibers are soluble in plenols, cresols, and formic acid. When using polymer fibers as tube forming substrates, hollow polymer fibers offer several advantages over solid polymer fibers. Not only do they allow enhanced removal of the fiber after deposition because they allow solvent or reactant to flow through the fiber but the hollow core allows room for expansion of the fiber during solvation. Since polymers swell during solvation, the hollow core allows expansion inward which decreases hoop stress on the wall material and allows for fabrication of thin-walled tubes using polymer fibers. Of course, before hollow fibers are coated with tube wall material, the ends must be sealed with either sacrificial material or with a material that will be removed, for example, by machining before the fiber is removed. After the fiber has been removed, the solvent is removed by drying or other appropriate means. In the case of metal, ceramic, or glass coatings, for example, the polymer fiber can also be chemically removed at elevated temperature by oxidation for example.

If polymer coatings are deposited on glass or metal fibers, these sacrificial tube formers can be removed at room temperature using an acid that will not harm the polymer coating. For example, hydrofluoric acid will attack metals and most glasses including quartz but will not attack many polymers.

Using different sacrificial tube formers, the tube walls can be made of practically any material as noted above and can even be of complex composition. For example, alloy tubes such as those made of stainless steel can be fabricated by a sputtering process. Ceramic tubes of boron nitride, silicon carbide or aluminum oxide can be fabricated directly, for example, by a chemical vapor deposition process. Alternatively, the tubes final composition can be achieved during the forming process itself using many different reactive processes. For example, aluminum oxide tubes can be made by oxidizing an aluminum coating before or after the fiber is removed and a silicon carbide tube can be made by heating a silicon coated carbon fiber before the fiber is removed. Conversion processes can also be performed on the tube after the fiber has been removed. An example would be the conversion of a carbon tube to a carbide tube by interaction with a metal vapor. Numerous types of composite materials can also be used to form the walls.

After the tubes have been formed as noted above, the inner diameter can be precisely changed if necessary either by deposition or reaction. For instance, CVD or electroless deposition can be used to precisely decrease the inner diameter of the tube. Alternatively, reactions such as oxidation can be used to either increase or decrease the inner diameter of the tube depending on whether the material is removed or oxidized to a material with a different structure. In addition, after the tubes are formed, they can be filled with a desired material to make rods of the desired shape and composition after the tube walls have been removed. Alternatively, the filled tubes can be sensors or detectors, for example.

A preform, being an object having a unique shape, is made when the fibers of the desired shape and diameter are positioned and oriented in a desired manner such as by attaching mechanically and/or bonding them to a manifold or having the fibers held in position by a fixture. Material is then deposited onto the fibers to a desired thickness and the fibers are then removed. Spaces between the coated fibers may or may not be filled before the fiber is removed.

A monolithic body, which is a solid body of one material, is formed when the space between the coated fibers is filled with the same material as the tube wall. Alternatively, the spaces between the coated fibers can be completely filled with a material(s) different than the wall material before the fibers are removed to produce a composite body. These bodies can be formed by taking a fiber preform and coating the fibers until no space is left. An alternative method is to make coated fibers and then place them in a desired orientation and position, whether random of ordered, and then fill the space in between.

The preform, the monolithic body and the composite can all be formed by the above fibers having different lengths, cross sectional areas and shapes. The tubes are formed essentially as noted above.

Figure 7A:
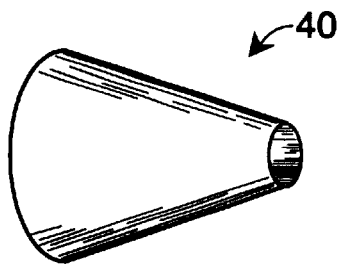
Figure 7B:
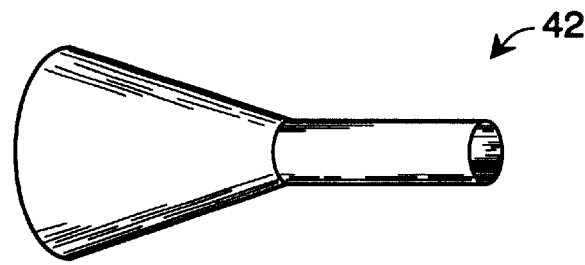
Figure 7C:
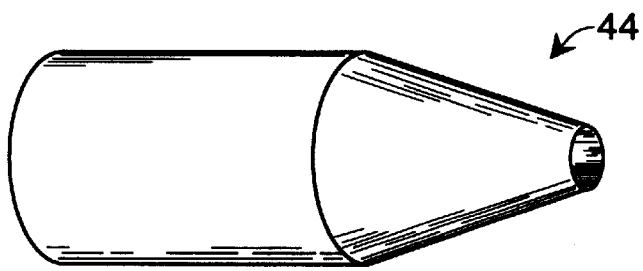
Figure 7D:
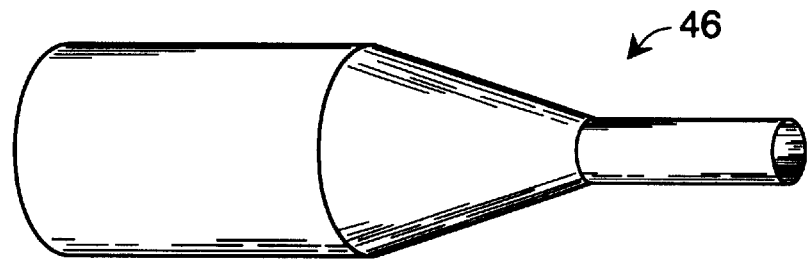

In order for microtubes to be useful in many applications, it is necessary to be able to interface them to the macroworld. This can be done in a variety of ways as seen in FIGS. 7E to 7H. In each of these examples it can be seen that the tubes are joined only on the ends in a pre-determined manner. A telescopic device 20 is illustrated in FIG. 7F where one fiber can be attached to others end-on. The fibers are then coated and removed to produce the telescopic device 20. Alternatively, coated fibers could be joined and then the fibers could be removed. A manifold device 30 or 40, FIGS. 7G and 7H, is made when numerous coated or uncoated fibers 32 are attached by melting, gluing, casting, etc. to a manifolding part which can be, for example, a block 34 or much larger diameter fiber. The manifolding part can be of the same or different material as the fibers. The ensemble of the manifolding part and the fibers is then coated in mass. The fibers and the manifolding material are then removed by the same or different processes to produce a manifold device 30 or 40 with numerous tubes 32 integrally attached so that the interior of the tubes and the manifold form a contiguous volume. A tapered device 10, FIG. 7E, can be fabricated by starting with a tapered fiber, coating it, and then removing the fiber. If a precise constant diameter is required at the end of the tapered tube, this can be accomplished in several ways, FIGS. 7A to 7D. If the tapered tube 40 can be drawn, a fiber of the desired constant diameter can be inserted into the end of the tapered tube and the tapered tube can be softened and drawn around it. After coating the ensemble, the constant diameter fiber would then be removed. Alternatively, the constant diameter fiber could be joined to a tapered fiber and the two coated together. When the core is removed the tapered tube with a constant diameter end would result. This process may result in several different forms: FIG. 7B, a tapered cone with a tube in the small end of the cone, 42; FIG. 7C, a tapered cone with a tube in the large end of the cone, 44; or FIG. 7D, a cone that serves as a transition region with a tube joined to both the small and large ends of the cone, 46.

It should be noted that for interfaces, such as the telescope or the taper, that they can be made from a single fiber by removal or addition of material. Thus, it is possible to start with a fiber and remove material with techniques, such as, ablation "trimming" with energy beams (electron, ion, laser) to produce a mandrel that is subsequently coated and removed, forming a taper or a telescoped tube interface component. Alternatively, material can be added to a fiber through techniques, such as melt extrusion or vapor deposition using a mask process to produce a mandrel for these components.

Figure 8:
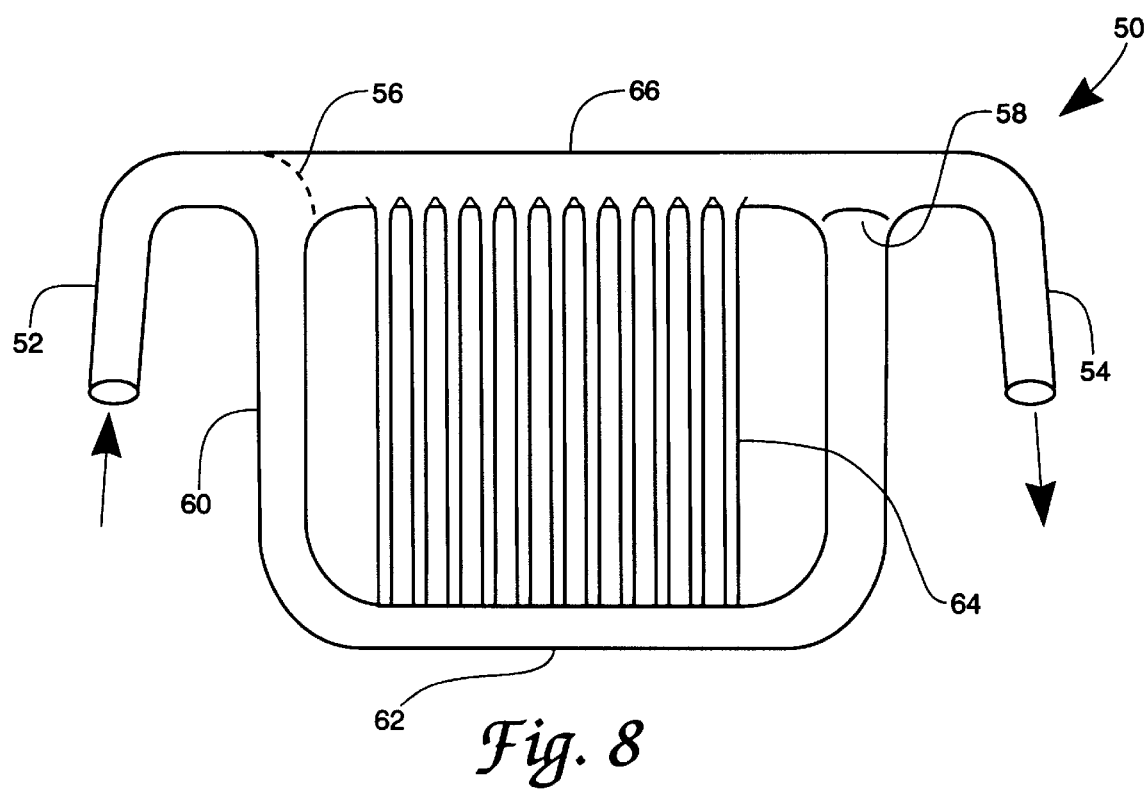
FIG. 8 illustrates a manifold having a plurality of microtubes therein.

Referring to FIG. 8, a harp shaped manifold 50 is shown. A gas is input into a hollow tube arm 52 and flows down vertical section 60 into a lower horizontal section 62. A plurality of microtubes 64 being of silver having an inside diameter of 100 microns and an outside diameter of 115 microns are connected into the horizontal section 62. The gas flows through these microtubes 64 into an upper horizontal section 66 and out of arm 54. Internal stops 56 and 58 prevent the flow of gas around the microtubes 64.

The devices made with the tubes of this invention form a unique and valuable raw material and product that can be fabricated into composites used in lightweight high strength structures. These hollow tubes, because of their extremely low weight yet relatively high strength, form the ideal material for the lightweight composite structures for the aircraft and spacecraft of the future.

So called "breathing structures" can also be made of these tubes that will allow liquid or gas transfer in only selected directions. Further, the hollow spaces in the tubes themselves impede heat transfer when appropriately encapsulated. Such lightweight heat shield structures are in great demand for hypersonic air vehicles and spacecraft.

Through careful fabrication, a variety of other devices can be produced using the microscopic hollow tubes; these include high efficiency heat exchangers and micro heat exchangers. Extremely accurate injectors for liquid fuel rocket engines can be designed by carefully controlling the form and internal diameter of the encapsulated tubes. The tubes have great potential value in catalysis where microtubes of platinum, for example, can be used in the form of platinum "wool" or as a coating of the interior or exterior of the microtubes. Other potential uses include low cost gas separation systems and light intensifier arrays. Microscopic hollow tubes and structures having microscopic holes or channels clearly have almost innumerable applications in the fields of lightweight structures, rocket propulsion, medicine, optics, micro-hydraulics and electronics.

Clearly, many modifications and variations of the present invention are possible in light of the above teachings and it is therefore understood, that within the inventive scope of the inventive concept, the invention may be practiced otherwise than specifically claimed.

What is claimed is:

1. Process for making a device, said device containing one or more microscopic hollow tubes positioned in a pre-selected, non-random orientation, said device have been made by a process comprising the steps of:

selecting one or more discrete fibers having a radial cross-section and axial configuration desired for the inner surface of said microscopic hollow tubes, said one or more fibers having a diameter of at least 0.1 microns and a predetermined rate of chemical reaction, solvation, decomposition, depolymerization or phase change, within a specific environment as noted in the last step;

positioning discrete fiber(s) in a preform in a pre-selected, non-random orientation corresponding to a desired final tube location, orientation and configuration, adjusting the temperature of said one or more fibers to a deposition temperature of a tube material, depositing said tube material on said one or more fibers to coat said one or more fibers to a thickness of at least 1 nanometer, said tube material having a predetermined rate of chemical reaction, solvation, decomposition, depolymerization, or phase change within a specific environment; which is lower than said predetermined rate of chemical reaction, solvation, decomposition, depolymerization or phase change of said one or more fibers;

placing said preform containing one or more discrete coated fibers positioned in said pre-selected, non-random orientation in said chemical reaction, solvation, decomposition, depolymerization, or phase change environment; and conducting a chemical reaction, solvation, decomposition, depolymerization, phase change or a combination of these techniques to thereby remove said one or more fibers from said tube material without destroying said tube material.

2. A process as defined in claim 1 in which the fiber surface is cleaned or activated before the deposition step.

3. A process as defined in claim 1 in which the fiber substrate is hollow.

4. A process as defined in claim 1 in which the fiber substrate has objects or materials implanted or imbedded in them.

5. A process as defined in claim 1 wherein coated ends of the coated fiber are removed before said fiber is removed.

6. A process as defined in claim 1 further including modification of the fiber surface by techniques that add material to, remove material from, or rearrange the material on the surface of said one or more fibers; the configuration of said surface modification determining the configuration of the inner wall surface of the tube after removal by chemical reaction, solvation, decomposition, depolymerization or phase change of said one or more fibers, and in some cases a portion or all of the material that has been deposited on the surface of said fibers to modify the fiber surface.

7. A process as defined in claim 1 further including chemically or physically altering the fiber coating before, during or after fiber removal whereby the fiber coating becomes the tube wall after the fiber removal.

8. A process as defined in claim 1 wherein the space between the coated fibers in the preform is filled with a material different than the fiber before the fibers are removed.

9. Process for making a device, said device containing one or more microscopic hollow tubes positioned in a pre-selected, non-random orientation, said device have been made by a process comprising the steps of:

selecting one or more discrete fibers having a radial cross-section and axial configuration desired for the inner surface of said microscopic hollow tubes, said one or more fibers having a diameter of at least 0.1 microns and a predetermined rate of chemical reaction, solvation, decomposition, depolymerization or phase change, within a specific environment;

separating discrete fibers and keeping them isolated and discrete from one another adjusting the temperature of said one or more fibers to a deposition temperature of a tube material, depositing said tube material on said one or more fibers to coat said one or more fibers to a thickness of at least 1 nanometer, said tube material having a predetermined rate of chemical reaction, solvation, decomposition, depolymerization, or phase change within a specific environment; which is lower than said predetermined rate of chemical reaction, solvation, decomposition, depolymerization or phase change of said one or more fibers;

placing and constraining said separate and discrete coated fibers in the position, orientation, and configuration required for the device, placing said constrained and coated fibers in said chemical reaction, solvation, decomposition, depolymerization, or phase change environment; and conducting a chemical reaction, solvation, decomposition, depolymerization, phase change or a combination of these techniques to thereby remove said one or more fibers from said tube material without destroying said tube material.

10. A process as defined in claim 9 in which the fiber surface is cleaned or activated before the deposition step.

11. A process as defined in claim 9 in which the fiber substrate is hollow.

12. A process as defined in claim 9 in which the fiber substrate has objects or materials implanted or imbedded in them.

13. A process as defined in claim 9 wherein coated ends of the coated fiber are removed before said fiber is removed.

14. A process as defined in claim 9 further including modification of the fiber surface by techniques that add material to, remove material from, or rearrange the material on the surface of said one or more fibers; the configuration of said surface modification determining the configuration of the inner wall surface of the tube after removal by chemical reaction, solvation, decomposition, depolymerization or phase change of said one or more fibers, and in some cases a portion or all of the material that has been deposited on the surface of said fibers to modify a the fiber surface.

15. A process as defined in claim 9 further including chemically or physically altering the fiber coating before, during or after fiber removal whereby the fiber coating becomes the tube wall after the fiber removal.

16. A process as defined in claim 9 wherein the space between the coated fibers in the preform is filled with a material different than the fiber before the fibers are removed.

17. A process for manufacturing a microscopic hollow tube, said method comprising the steps of:

selecting one fiber characterized by a radial cross-section and axial configuration desired for the inner surface of said microscopic hollow tube, said one fiber having an inside diameter of at least 5 nanometers and a predetermined rate of chemical reaction, solvation, decomposition, depolymerization or phase change within a specific environment to remove said one fiber;

placing the fiber in the deposition environment and adjusting the temperature of said one fiber to a deposition temperature of a tube material;

depositing said tube material on said one fiber to coat said one fiber to a thickness of at least 1 nanometer, said tube material having a predetermined rate of chemical reaction, solvation, decomposition, depolymerization or phase change which is lower than said predetermined rate of chemical reaction, solvation, decomposition, depolymerization or phase change of said one fiber;

placing said one fiber in a pre-selected position in said reaction, solvation, decomposition, depolymerization or phase change environment; and conducting a reaction, solvation, decomposition, depolymerization or phase change to thereby remove said one fiber from said tube material without destroying said tube material.

18. A process as defined in claim 17 wherein the fiber is placed in a fixture during the deposition process in order to keep the fiber separate from other fibers and to ensure a more uniform coating.

19. A process as defined in claim 17 wherein coated ends of the coated fiber are removed before said fiber is removed.

20. A process as defined in claim 17 wherein the fiber substrate is hollow.

21. A process as defined in claim 17 in which the fiber substrate has objects or materials implanted or imbedded in them.

22. A process as defined in claim 17 in which the fiber surface is cleaned or activated before the deposition step.

23. A process as defined in claim 17 further including modification of the fiber surface by techniques that add material to, remove material from, or rearrange the material on the surface of said one or more fibers; the configuration of said surface modification determining the configuration of the inner wall surface of the tube after removal by chemical reaction, solvation, decomposition, depolymerization or phase change of said one or more fibers, and in some cases a portion or all of the material that has been deposited on the surface of said fibers to modify the fiber surface.

24. A process as defined in claim 17 further including chemically or physically altering the fiber coating before, during or after fiber removal whereby the fiber coating becomes the tube wall after the fiber removal.

25. A process as defined in claim 17 further including a step of filling said microscopic hollow tube with a material different than said one fiber.

* * * * *